(12) United States Patent
Naito

(10) Patent No.: US 10,834,819 B2
(45) Date of Patent: Nov. 10, 2020

(54) PRINTED CIRCUIT BOARD AND ITS MANUFACTURING METHOD

(71) Applicant: CANON KABUSHIKI KAISHA, Tokyo (JP)

(72) Inventor: Dai Naito, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/601,046

(22) Filed: Oct. 14, 2019

(65) Prior Publication Data

US 2020/0128668 A1    Apr. 23, 2020

(30) Foreign Application Priority Data

Oct. 18, 2018   (JP) .................. 2018-196536

(51) Int. Cl.
  *H05K 1/11*   (2006.01)
  *H05K 3/34*   (2006.01)

(52) U.S. Cl.
  CPC ............. *H05K 1/116* (2013.01); *H05K 3/34* (2013.01); *H05K 3/3484* (2013.01); *H05K 3/3494* (2013.01); *H05K 2201/10151* (2013.01)

(58) Field of Classification Search
  CPC .......... H05K 1/111; H05K 1/11; H05K 1/112; H05K 1/113; H05K 1/114; H05K 3/303; H05K 3/305; H05K 3/34; H05K 3/341; H05K 3/3431; H05K 3/3436; H05K 3/3442
  See application file for complete search history.

(56) References Cited

U.S. PATENT DOCUMENTS

| | | | | |
|---|---|---|---|---|
| 6,316,736 B1* | 11/2001 | Jairazbhoy | ............. | H05K 1/111 174/260 |
| 7,544,899 B2* | 6/2009 | Kamada | ............... | H05K 1/0201 174/260 |
| 2005/0252682 A1* | 11/2005 | Shimoto | ............. | H01L 21/4857 174/260 |
| 2017/0048472 A1* | 2/2017 | Yang | ................. | H01L 27/14618 |
| 2018/0233473 A1* | 8/2018 | Fukuhara | ........... | B23K 35/3613 |

FOREIGN PATENT DOCUMENTS

JP    2016-062768 A    4/2016

\* cited by examiner

*Primary Examiner* — Jeremy C Norris
(74) *Attorney, Agent, or Firm* — Cowan, Liebowitz & Latman, P.C.

(57) ABSTRACT

A printed circuit board includes an electronic component having a first land, and a printed wiring board having a second land soldered to the first land. The printed wiring board includes a first wiring pattern, a resist opening formed around the second land configured to expose at least part of the first wiring pattern to outside, and a second wiring pattern disposed at least a portion of a periphery of the resist opening. A heat capacity of the first wiring pattern is smaller than that of the second wiring pattern.

8 Claims, 7 Drawing Sheets

PRINTED CIRCUIT BOARD AND ITS MANUFACTURING METHOD

BACKGROUND OF THE INVENTION

Field of the Invention

The present invention relates to a printed circuit board mounted in an electronic apparatus, such as a digital camera, and its manufacturing method.

Description of the Related Art

A recent electronic apparatus, such as digital camera, has been provided with a large-scale electronic circuit for a higher performance, and made smaller to improve the usability. An electronic component in the electronic apparatus often uses a package such as BGA (Ball Grid Array), LGA (Land Grid Array), and LCC (Leaded Chip Carrier), which can be made smaller and increase the number of terminals. One conventional method of soldering a package on a printed wiring board in a reflow mounting method uses a thermosetting resin-containing solder paste in which a solder powder and a thermosetting epoxy resin are mixed with each other. This method can improve the soldering reliability between the package and the printed wiring board, but causes the epoxy resin to flow out of the package or the printed wiring board unless the flow of the epoxy resin is controlled. The epoxy resin flowing out disadvantageously causes an insufficient adhesion between the package and the printed wiring board and adhesion to other components. In order to control a behavior of the epoxy resin flowing out of the package, Japanese Patent Laid-Open No. ("JP") 2016-62768 discloses a structure that dams up the epoxy resin by attaching a frame-shaped member along the outer shape of the printed wiring board.

However, the structure disclosed in JP 2016-62768 requires the frame member to be separately attached to the printed wiring board, and thus increases the manufacturing cost. Although epoxy resin is thermosetting, curing may be inadequate only with a heat load for the reflow mounting process time which solders the package onto the printed wiring board. In that case, it is necessary to reheat the printed circuit board (package mounted printed wiring board) in an oven or the like to cure the epoxy resin. When the printed circuit board is reheated, the product cost increases due to the complexity of the process, and the heat load on the package becomes a problem. Many packages expect the heat load only for the reflow mounting process time during which the package and printed wiring board are soldered together, and any other thermal loads may cause a problem such as a leak current and unexpected circuit opening.

SUMMARY OF THE INVENTION

The present invention provides a printed circuit board configured to improve a soldering reliability between a package and a printed wiring board without increasing the number of components or processes, and a method for manufacturing the same.

A printed circuit board according to one aspect of the present invention includes an electronic component having a first land, and a printed wiring board having a second land soldered to the first land. The printed wiring board includes a first wiring pattern, a resist opening formed around the second land configured to expose at least part of the first wiring pattern to outside, and a second wiring pattern disposed at least a portion of a periphery of the resist opening. A heat capacity of the first wiring pattern is smaller than that of the second wiring pattern.

An electronic apparatus having the above printed circuit board also constitutes another aspect of the present invention.

A method according to another aspect of the present invention for manufacturing a printed circuit board that includes an electronic component having a first land, a second land soldered to the first land, a first wiring pattern, a resist opening formed around the second land and configured to expose at least part of the first wiring pattern to outside, and a second wiring pattern disposed at least a portion of a periphery of the resist opening, wherein a heat capacity of the first wiring pattern is smaller than that of the second wiring pattern includes the steps of a supplying step of supplying a solder paste containing a solder powder and a thermosetting resin to the second land, a mounting step of mounting the electronic component on the printed wiring board so that the first land opposes to the second land, and a soldering step of the electronic component on the printed wiring board in a reflow mounting method using the solder paste. The soldering step solders the first land and the second land on each other, and brings the thermosetting resin into contact with the first wiring pattern so as to promote curing of the thermosetting resin.

Further features of the present invention will become apparent from the following description of exemplary embodiments with reference to the attached drawings.

DESCRIPTION OF THE EMBODIMENTS

Figure 1:
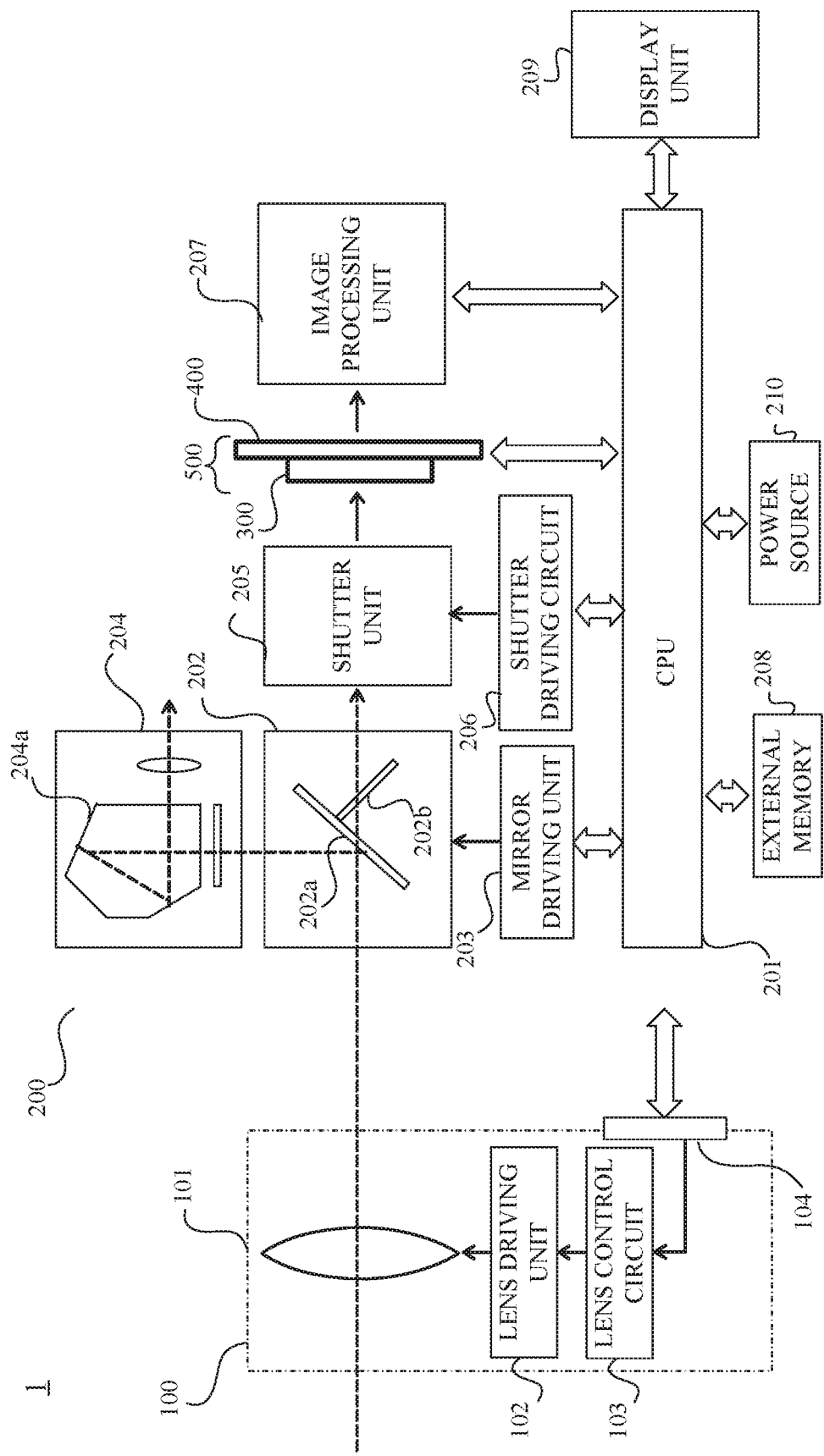
FIG. 1 is a block diagram of a digital single-lens reflex camera as an illustrative electronic apparatus according to one embodiment of the present invention.

Referring now to the accompanying drawings, a description will be given of embodiments according to the present invention. Corresponding elements in respective figures will be designated by the same reference numerals, and a duplicate description thereof will be omitted.

FIG. 1 is a block diagram of a digital single-lens reflex camera 1 which is an illustrative electronic apparatus according to one embodiment of the present invention. The digital single-lens reflex camera 1 includes a lens unit 100 and a camera body 200.

The lens unit 100 includes a lens group 101 including a plurality of zoom lenses that freely change a focal length within a predetermined range and a plurality of focus lenses that form an object image. A lens driving unit 102 includes an actuator, such as a stepping motor, and changes an optical magnification of the object image by changing the position of the zoom lens in the lens group 101. In addition, the lens driving unit 102 focuses on the object by changing the position of the focus lens in the lens group 101. A lens control circuit 103 transmits to the lens driving unit 102 a driving amount necessary for a moving amount and moving speed of the zoom lens and the focus lens in the lens group 101, and controls driving of the zoom lens and the focus lens in the lens group 101. A lens mount contact 104 serves to transmit and receive a signal communicated between the camera body 200 and the lens control circuit 103 when the lens unit 100 is attached to the camera body 200.

A CPU 201 is an operation processing unit disposed in the camera body 200 and configured to perform a variety of controls over the lens unit 100 and the camera body 200. A mirror unit 202 includes a main mirror 202a and a sub mirror 202b. By changing angular positions of the main mirror 202a and the sub mirror 202b, a direction of an imaging light beam passing through the lens unit 100 can be changed. A mirror driving unit 203 includes a motor (not shown), a gear train (not shown), and the like, and drives the main mirror 202a and the sub mirror 202h in the mirror unit 202 according to a signal from the CPU 201. A viewfinder unit 204 includes a pentaprism 204a that converts and reflects the imaging light beam reflected by the main mirror 202a into an erect image, a photometric sensor (not shown) that detects the brightness of the object, and the like. A shutter unit 205 is, for example, a mechanical focal plane shutter, and includes a mechanism for moving a front blade group and a rear blade group (not shown). Based on the signal from the CPU 201, a shutter driving circuit 206 controls the shutter unit 205 so as to block the imaging light beam when the user observes the object image through the viewfinder unit 204, and obtain a desired exposure time according to a release signal during image capturing.

An image pickup unit (printed circuit board) 500 includes an image sensor 300 and a printed wiring board 400. The image sensor 300 includes a CMOS image sensor, a CCD, or the like having an image pickup plane provided with pixels arranged in a matrix. The printed wiring board 400 is a multilayer board on which the image sensor 300 is mounted by a reflow mounting process.

A description will now be given of the reflow mounting process. In the reflow mounting process, a paste solder is printed on the printed wiring board, a package to be mounted is mounted on it, and the printed wiring board is passed through a reflow furnace. In the reflow furnace, the peak temperature is equal to or higher than the melting point of the solder, therefore the solder melts, and the package and the printed wiring board are soldered together by a subsequent cooling process.

The image pickup unit 500 receives light incident from the object via the lens unit 100 on the image pickup plane, and supplies the CPU 201 with an image obtained by photoelectrically converting the light from the object. The image pickup plane of the image sensor 300 includes an image pickup pixel for capturing an object image, and a phase difference detecting pixel for detecting a phase difference of an optical object image, which is used for the image plane phase difference type autofocus.

The CPU 201 calculates a defocus amount based on the object image for each divided area or the phase difference (distance between images) of the pupil-divided image obtained from the pixel signal output from the phase difference detecting pixel. The CPU 201 transmits the calculated defocus amount to the lens control circuit 103 via the lens mount contact 104. The lens driving unit 102 drives the focus lens in the lens group 101 in accordance with a signal from the lens control circuit 103.

The object image formed on the image pickup pixel is photoelectrically converted into an imaging signal, and the imaging signal is accumulated as an analog signal and transmitted to an image processing unit 207. The image processing unit 207 sequentially receives the analog signal of the object image accumulated in the image pickup unit 500 and converts it into a digital signal, then performs image processing such as a color correction, demosaicing processing, a gradation correction et correction), YC separation processing, and the like, for it so as to convert it into image data. The image data generated by the image processing unit 207 is compressed by a predetermined compression method, such as the JPEG method, and stored in an external memory 208. The external memory 208 is a nonvolatile memory, such as an SD memory card and a compact flash (registered trademark), which can be attached to and detached from the camera body 200.

A display unit 209 includes rotatable and openable TFT liquid crystal. The display unit 209 displays the image data converted by the image processing unit 207 and the image data read out of the external memory 208 and expanded. In capturing a motion image, the image processing unit 207 sequentially converts the imaged light flux received by the image pickup unit 500, and displays an object image on the display unit 209.

A power source 210 includes a detachable secondary battery, a household AC power source, or the like, and supplies power to each unit.

Figure 2A:
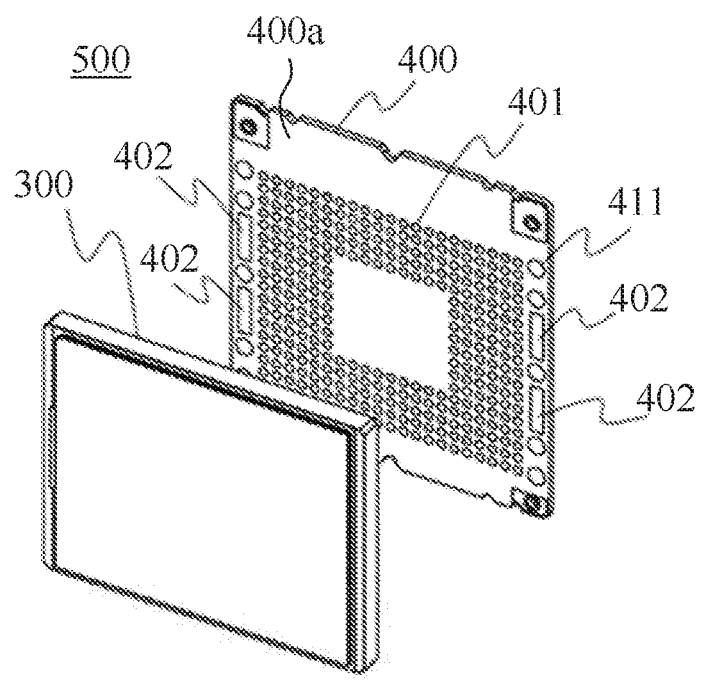
FIGS. 2A and 2B are perspective views of an image sensor and a printed wiring board.
Figure 2B:
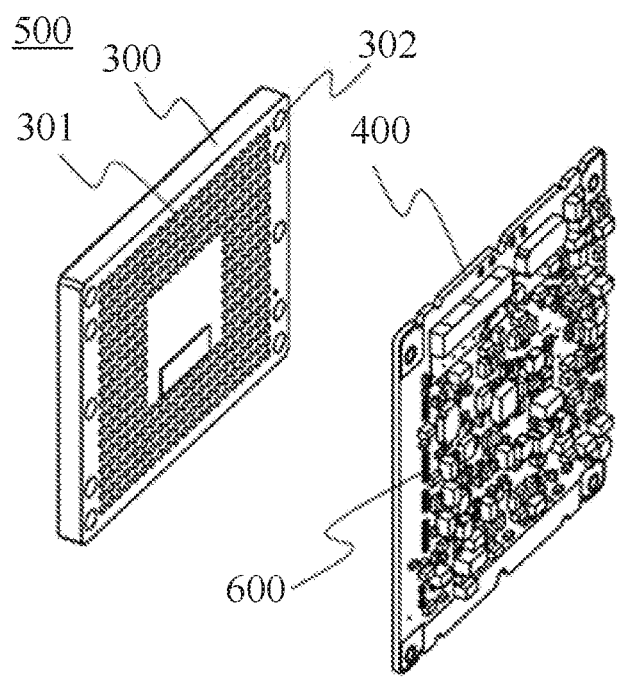
Figure 3:
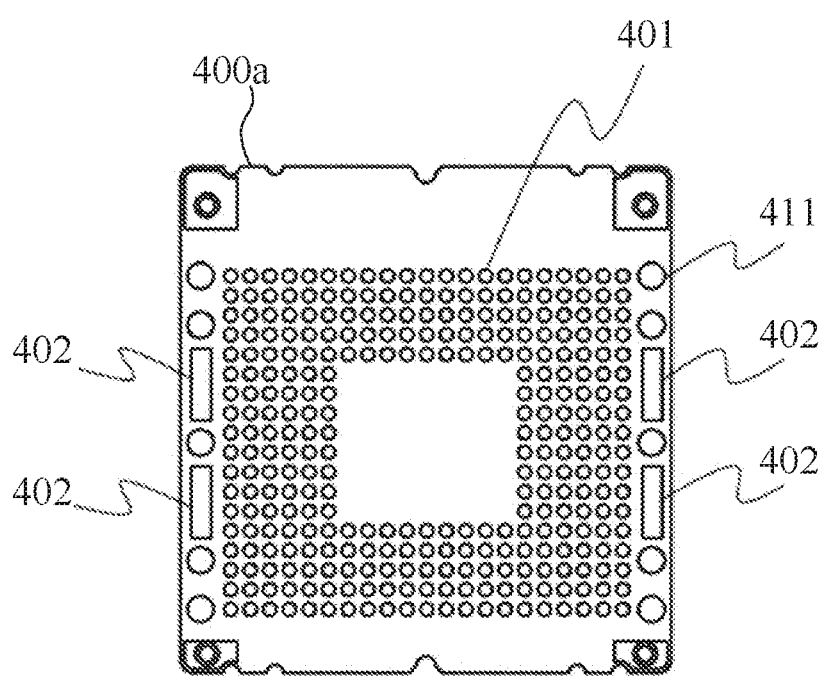
FIG. 3 is a front view of the printed wiring board.
Figure 4A:
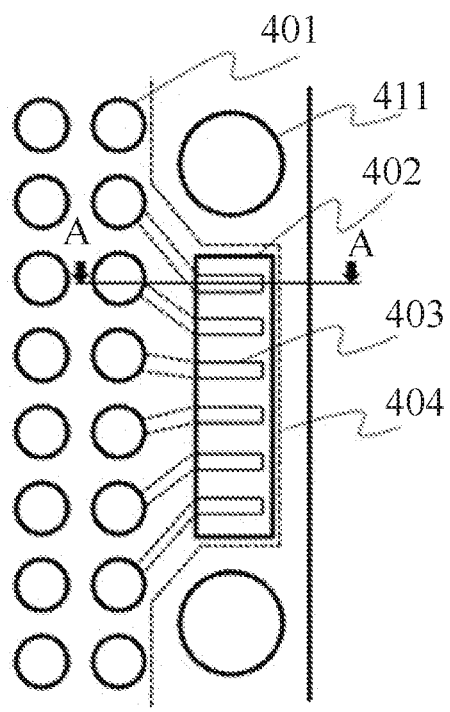
FIGS. 4A and 4B are enlarged views of a resist opening in the printed wiring board.
Figure 4B:
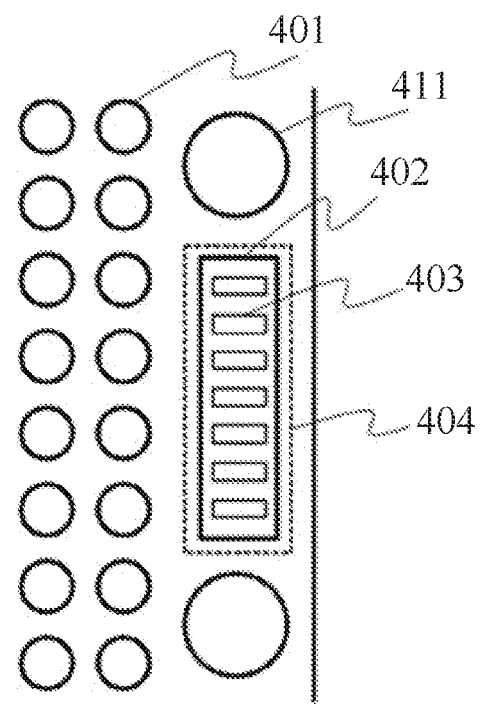

A description will now be given of a method for mounting an electronic component. FIGS. 2A and 2B are perspective views of the image sensor 300 and the printed wiring board 400. FIG. 2A is viewed from a front surface side (object side), and FIG. 2B is viewed form a back surface side. FIG. 3 is a front view of the printed wiring board 400. FIGS. 4A and 4B are enlarged views of a resist opening 402 in the printed wiring board 400.

The image sensor 300 is an LGA package. A plurality of image sensor lands (first lands) 301 and image sensor reinforcing terminals 302 are provided on the hack surface of the image sensor 300. A first mounting surface 400a of the printed wiring board 400 has a printed wiring board land (second land) 401 to be soldered to the image sensor land 301 and a printed wiring board reinforcing terminal 411 to be soldered to the image sensor reinforcing terminal 302. The image sensor land 301 and the printed wiring board land 401 are joined together by a thermosetting resin-containing solder paste 407. The image sensor reinforcing terminal 302 and the printed wiring board reinforcing terminal 411 are GND signal terminals, and improve the soldering reliability and the GND connectivity between the image sensor 300 and the printed wiring board 400.

The thermosetting resin-containing solder paste 407 is a solder paste containing at least a solder powder and a thermosetting resin 408 described later. The thermosetting resin-containing solder paste 407 may contain a flux component necessary for soldering. The thermosetting resin-containing solder paste 407 can be supplied by screen printing, a dispenser, or the like, similar to a normal solder paste, and solders the image sensor 300 and the printed wiring board 400 in a thermal process such as the reflow mounting process. When the solder powder is melted during heating in the reflow mounting process, the solder powder and the thermosetting resin 408 are separated from each other. After the separation, the thermosetting resin 408 is cured around the solder and the periphery thereof, serves as a reinforcing resin that reinforces the bonding between the image sensor 300 and the printed wiring board 400, and can improve the soldering reliability between the image sensor 300 and the printed wiring board 400.

In this embodiment, the thermosetting resin 408 is one type of anaerobic adhesive. The anaerobic adhesive is an adhesive, such as liquid acrylic, which is bonded by blocking oxygen in the presence of metal ions. Curing stops under air, and curing proceeds in contact with metal. In other words, the heat application and metal contact efficiently cure the thermosetting resin 408.

In this embodiment, the image sensor 300 has a rectangular shape having a long side and a short side, as illustrated in FIGS. 2A and 2B. In the printed wiring board 400, the resist opening 402 is provided between the printed wiring board reinforcing terminals 411 along the short side of the image sensor 300.

The resist opening 402 is provided outside the printed wiring board land 401. A copper foil exposed portion (first wiring pattern) 403 that is a metal is provided in the resist opening 402. The resist opening 402 may be provided so as to expose at least part of the copper foil exposed portion 403 to the outside. A GND pattern (second wiring pattern) 404 is provided on at least part of the periphery of the resist opening 402. The copper foil exposed portion 403 is a signal line from the printed wiring board land 401 in FIG. 4A, a single slit pattern in FIG. 4B, or the like. The copper foil exposed portion 403 is a pattern thinner than the GND pattern 404 and has a smaller heat capacity, even if it is a pattern of one of FIGS. 4A and 4B.

Figure 5A:
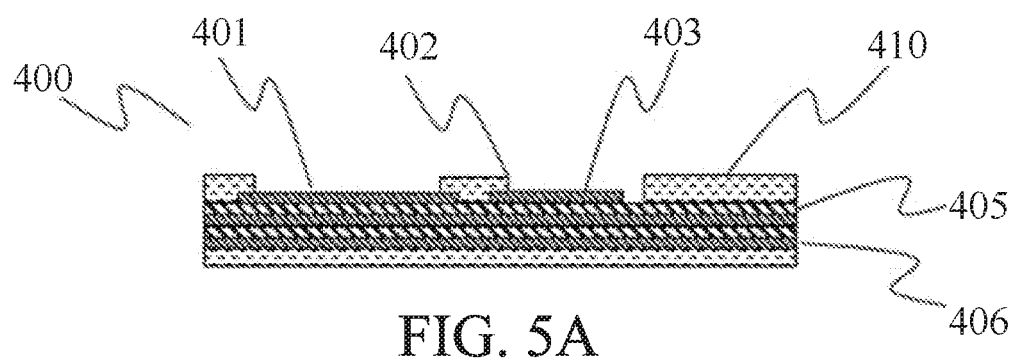
FIGS. 5A to 5D are explanatory diagrams of a method for manufacturing an image pickup unit.
Figure 5B:
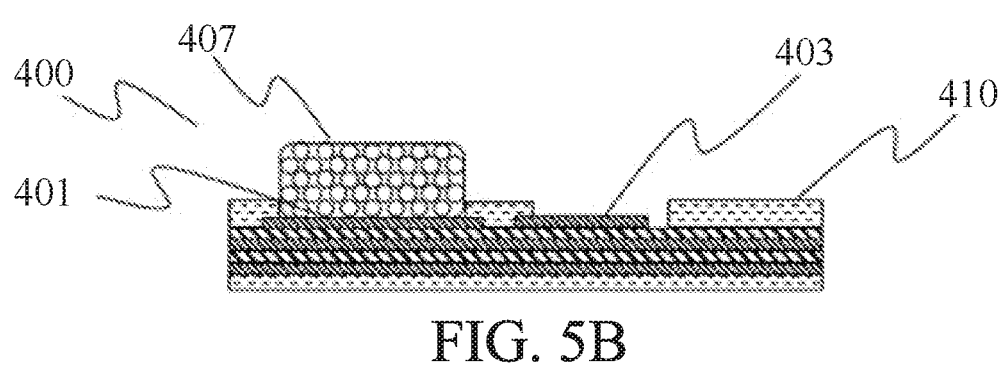
Figure 5C:
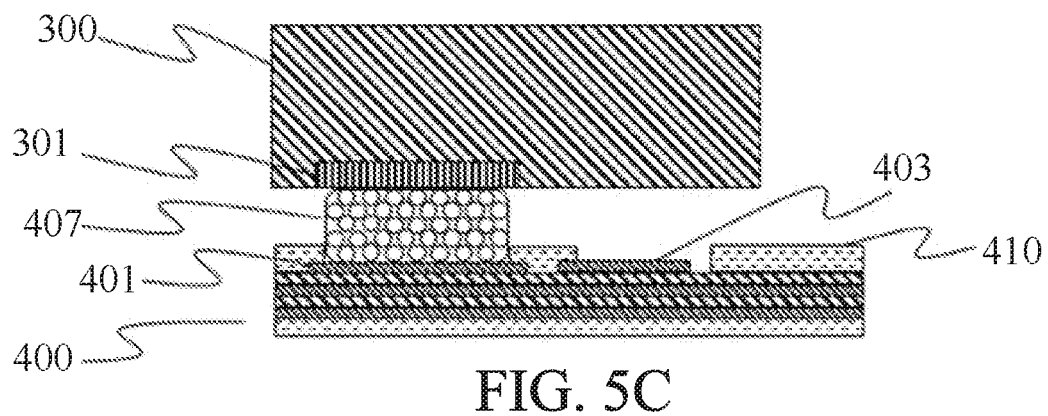
Figure 5D:
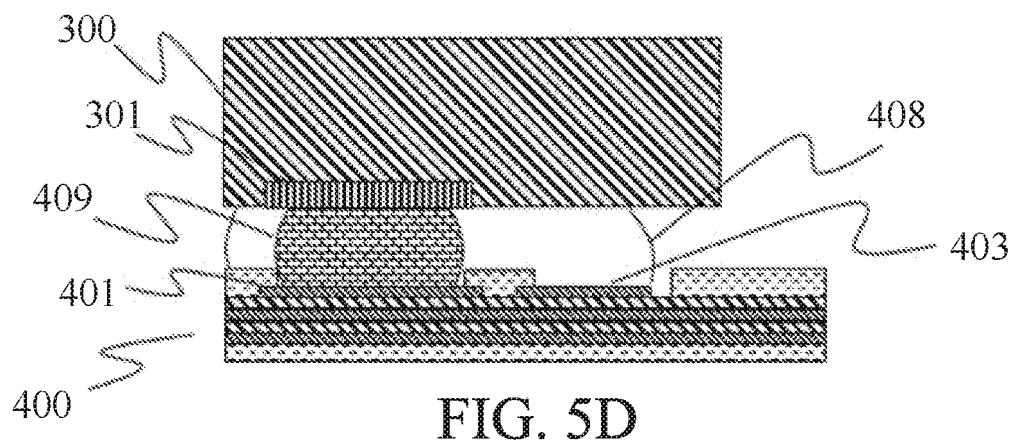
Figure 6:
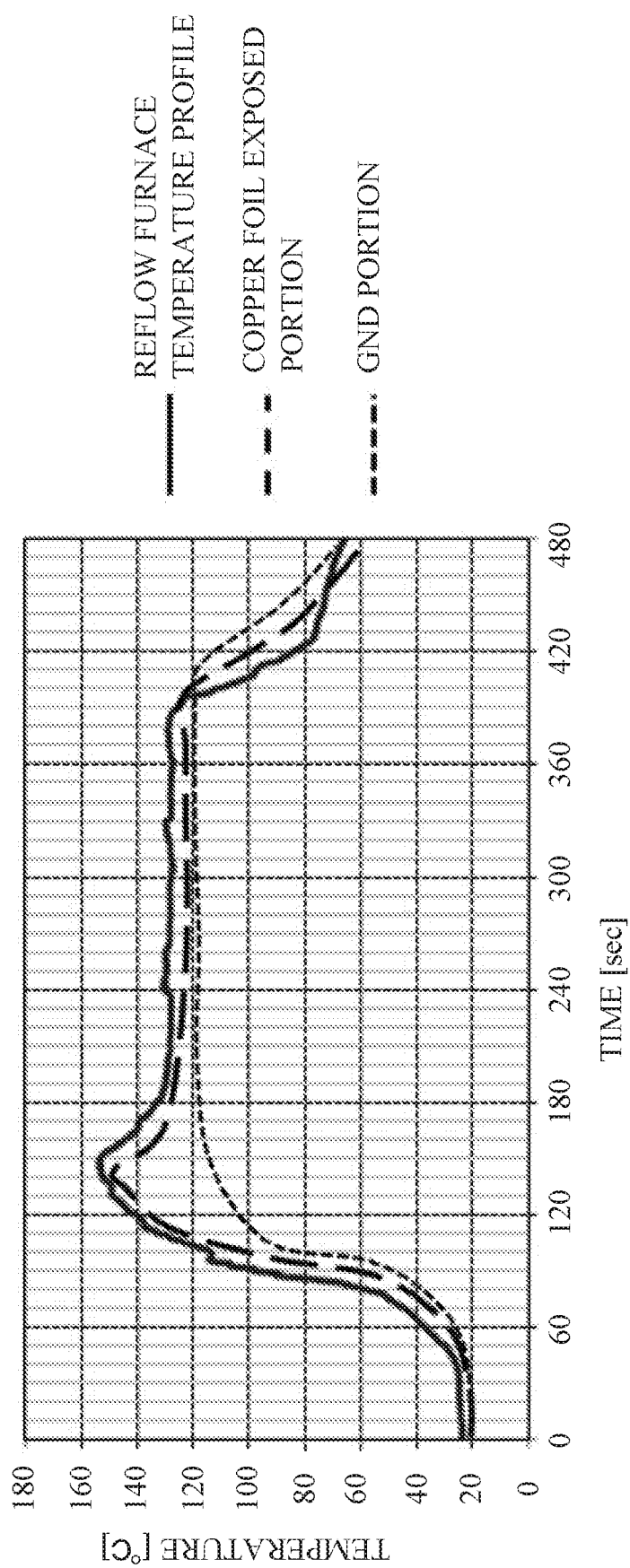
FIG. 6 illustrates a temperature profile in a reflow furnace.

Referring now to FIGS. 5A to 5D and 6, a description will be given of a method for soldering the image sensor 300 on the printed wiring board 400 in the reflow mounting method using the thermosetting resin-containing solder paste 407. FIGS. 5A to 5D are explanatory diagrams of a method for manufacturing the image pickup unit 500, and illustrate a mounting embodiment of the image sensor 300 onto the printed wiring board 400. FIG. 6 illustrates a temperature profile of the reflow furnace.

FIG. 5A is a sectional view taken along a line A-A in FIG. 4A. The printed wiring board 400 is a multilayer printed circuit board in which a base 405, such as a glass epoxy material, and a conductor portion 406, such as a copper foil, are alternately laminated. The printed wiring board land 401 and the copper foil exposed portion 403 are provided on the top surface (first mounting surface 400a) of the printed wiring board 400. Further, the top surface of the printed wiring board 400 is partially covered with a solder resist 410 as an insulating layer.

FIG. 5B illustrates a completed state of the supplying process (supplying step) of supplying the thermosetting resin-containing solder paste 407 onto the printed wiring board land 401. As described above, the thermosetting resin-containing solder paste 407 contains the solder powder and the thermosetting resin 408 and can be supplied by screen printing or a dispenser. As illustrated in FIG. 5B, the thermosetting resin-containing solder paste 407 may be supplied so as to completely cover the printed wiring board land 401, or may partially cover the printed wiring board land 401 as in so-called offset printing.

FIG. 5C illustrates a completed state of the mounting process (mounting step) of mounting the image sensor 300 on the printed wiring board 400 supplied with the thermosetting resin-containing solder paste 407 using a mounter. The image sensor 300 is mounted on the printed wiring board 400 by the mounter so that an image sensor land 301 is opposite to the printed wiring board land 401.

FIG. 5D illustrates a solder heating process (mounting step) for joining the image sensor 300 and the printed wiring board 400 together after the solder powder contained in the solder paste 407 containing the thermosetting resin is melted. The solder heating process is performed in a reflow furnace. In the solder heating step, the solder powder contained in the thermosetting resin-containing solder paste 407 is melted, and the thermosetting resin-containing solder paste 407 is separated into solder and thermosetting resin 408. The molten solder becomes a solder joint 409 that joins the printed wiring board land 401 and the image sensor land 301. When the thermosetting resin-containing solder paste 407 is melted and separated into the solder and the thermosetting resin 408, the surface area of the thermosetting resin 408 is smaller than that in the paste state, and as a result, the apparent viscosity lowers and the fluidity increases. The thermosetting resin 408 having an improved fluidity tends to flow into a portion where a gap between the printed wiring board 400 and the image sensor 300 is narrow due to the capillary phenomenon. Since the surfaces of the printed wiring board 400 and the image sensor 300 are not ideal planes, the gap outside the image sensor 300 and the printed wiring board 400 become relatively narrower depending on the warpage state. Hence, the thermosetting resin 408 tends to flow outside the image sensor 300 and the printed wiring board 400. When the thermosetting resin 408 flows outside the image sensor 300 and the printed wiring board 400, a sufficient adhesion amount between the image sensor 300 and the printed wiring board 400 cannot be secured and a damage caused by the thermosetting resin 408 adhering to other components is concerned. Therefore, conventionally, it is necessary to perform a resin curing heating process using an oven or the like after the solder heating process ends.

In this embodiment, as described above, the thermosetting resin 408 tends to flow outside the image sensor 300 and the printed wiring board 400 in the solder heating step. At that time, the thermosetting resin 408 passes over the copper foil exposed portion 403. As described above, the copper foil exposed portion 403 has a heat capacity smaller than that of the surrounding GND pattern 404. As illustrated in FIG. 6, the temperature of the GND pattern 404 moderately rises, but since the copper foil exposed portion 403 has a small heat capacity, the temperature rise substantially follows the temperature profile of the reflow furnace. Thus, the copper foil exposed part 403 is kept at a high temperature for a long time immediately after the solder heating process starts. By keeping the copper foil exposed portion 403 at a high temperature for a long time, curing of the thermosetting resin 408 flowing out on the copper foil exposed portion 403 is promoted. Moreover, since the thermosetting resin 408 is an anaerobic adhesive, curing is accelerated when it contacts the copper foil exposed part 403 as a metal. In this embodiment, as described above, curing of the thermosetting resin 408 can be promoted by providing the resist opening 402 and the copper foil exposed portion 403 that has a small heat capacity and is kept at a high temperature for a long time. Therefore, this embodiment does not need the heating step of curing the resin after the solder heating step unlike the prior art. Hence, this embodiment can simplify the mounting process and reduce the heat load on the devices on the printed wiring board 400 including the image sensor 300.

Figure 7:
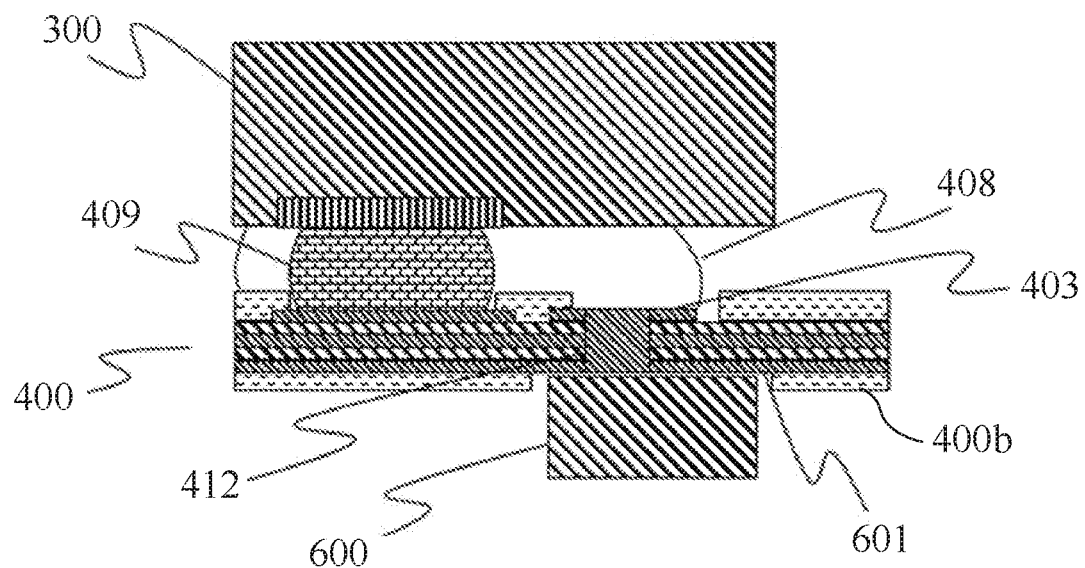
FIG. 7 illustrates the printed wiring board that has been soldered in a reflow mounting method.

FIG. 7 illustrates the printed wiring board 400 that has been soldered in the reflow mounting method. A device, such as a bypass capacitor 600 as a heat generating component, is mounted on a second mounting surface 400b opposite to the first mounting surface 400a of the printed wiring board 400. The bypass capacitor 600 is mounted on a bypass capacitor land (third land) 601 provided on the second mounting surface 400b. The temperature of the bypass capacitor 600 rises with the temperature of the image sensor 300 when the image sensor 300 is driven by performing still image continuous capturing or motion image capturing using the digital single-lens reflex camera 1. Since the bypass capacitor land 601 is connected to the copper foil exposed portion 403 through the through-hole 412, the heat generated by the bypass capacitor 600 is transmitted to the copper foil exposed portion 403. Hence, even if the thermosetting resin 408 is incompletely cured in the solder heating process, the bypass capacitor 600 becomes hot by performing still image continuous capturing or motion image capturing by the digital single-lens reflex camera 1, and curing of the thermosetting resin 408 can be promoted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-196536, filed on Oct. 18, 2018, which is hereby incorporated by reference herein in its entirety.

What is claimed is:

1. A printed circuit board comprising:
    an electronic component having a first land; and
    a printed wiring board having a second land soldered to the first land, the second land being disposed so as to face the first land,
    wherein in the printed wiring board, in order from a side of the first land, an insulating layer and a first wiring pattern are formed,
    wherein the insulating layer includes a resist opening formed adjacent to the second land with a predetermined distance, the resist opening being configured to expose at least part of the first wiring pattern to outside, and the second land exposed to outside with the insulating layer not being formed, and
    wherein the printed wiring board further includes a second wiring pattern disposed at least a portion of a periphery of the resist opening, and
    wherein a heat capacity of the first wiring pattern is smaller than that of the second wiring pattern.

2. An electronic apparatus comprising a printed circuit board,
    wherein the printed circuit board includes:
    an electronic component having a first land; and
    a printed wiring board having a second land soldered to the first land, the second land being disposed so as to face the first land,
    wherein in the printed wiring board, in order from a side of the first land, an insulating layer and a first wiring pattern are formed,
    wherein the insulating layer includes a resist opening formed adjacent to the second land with a predetermined distance, the resist opening being configured to expose at least part of the first wiring pattern to outside, and the second land exposed to outside with the insulating layer not being formed, and
    wherein the printed wiring board further includes a second wiring pattern disposed at least a portion of a periphery of the resist opening, and
    wherein a heat capacity of the first wiring pattern is smaller than that of the second wiring pattern.

3. A method for manufacturing a printed circuit board that includes:
    an electronic component having a first land; and
    a printed wiring board having:
        an insulating layer covering a top surface of a wiring of the printed wiring board on an electronic component side;
        a second land soldered to the first land, the second land exposed to outside with the insulating layer not being formed;
        a first wiring pattern;
        a resist opening, on which the insulating layer is not formed, formed around the second land and configured to expose at least part of the first wiring pattern to outside; and
        a second wiring pattern disposed at least a portion of a periphery of the resist opening, wherein a heat capacity of the first wiring pattern is smaller than that of the second wiring pattern,
    the method comprising the steps of:
    a supplying step of supplying a solder paste containing a solder powder and a thermosetting resin to the second land;
    a mounting step of mounting the electronic component on the printed wiring board so that the first land opposes to the second land; and
    a soldering step of soldering the electronic component on the printed wiring board in a reflow mounting method using the solder paste,
    wherein the soldering step melts the solder paste and separates the solder paste into the solder powder and the thermosetting resin,
    wherein the soldering step solders the first land and the second land on each other, and,
    wherein the soldering step makes the thermosetting resin get over, from the second land, the insulating layer formed between the second land and the resist opening to flow outside the printed wiring board, and the soldering step makes the thermosetting resin contact with the first wiring pattern.

4. The method according to claim 3, wherein the electronic component has a rectangular shape having a long side and a short side, and
    wherein the resist opening is formed along the short side.

5. The method according to claim 3, wherein the electronic component is an image sensor.

6. The method according to claim 3, wherein the thermosetting resin is an anaerobic adhesive whose curing is promoted in contact with metal.

7. The method according to claim 3, wherein the printed wiring board includes:
    a third land provided on a surface opposite to a surface on which the second land is provided, and connected to the first wiring pattern through a through-hole; and
    a heat generating component soldered to the third land.

8. The method according to claim 3, wherein the first wiring pattern is partially but not fully covered by the resist opening.

* * * * *